United States Patent
Lai et al.

(10) Patent No.: US 9,101,074 B2
(45) Date of Patent: Aug. 4, 2015

(54) CAPACITOR AND MULTILAYER CIRCUIT BOARD USING SAME

(71) Applicant: HON HAI PRECISION INDUSTRY CO., LTD., New Taipei (TW)

(72) Inventors: Ying-Tso Lai, New Taipei (TW); Hsiao-Yun Su, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 87 days.

(21) Appl. No.: 13/928,428

(22) Filed: Jun. 27, 2013

(65) Prior Publication Data
US 2014/0000949 A1    Jan. 2, 2014

(30) Foreign Application Priority Data
Jun. 28, 2012   (TW) .............................. 101123233 A

(51) Int. Cl.
*H05K 1/18*    (2006.01)
*H05K 1/16*    (2006.01)

(52) U.S. Cl.
CPC ................ *H05K 1/185* (2013.01); *H05K 1/162* (2013.01); *H05K 2201/09672* (2013.01); *H05K 2201/09881* (2013.01)

(58) Field of Classification Search
USPC ......................... 361/763, 764, 301.4; 174/260
See application file for complete search history.

(56) References Cited

U.S. PATENT DOCUMENTS

2012/0146182 A1*   6/2012   Oganesian et al. ........... 257/532

FOREIGN PATENT DOCUMENTS

TW          I295909 B     4/2008
TW          M432221 U1    6/2012

* cited by examiner

*Primary Examiner* — Andargie M Aychillhum
(74) *Attorney, Agent, or Firm* — Novak Druce Connolly Bove + Quigg LLP

(57) ABSTRACT

A capacitor includes a first patterned conductive layer, a second patterned conductive layer and a first patterned dielectric layer. The first patterned conductive layer resembles a comb with internal teeth, and the second patterned conductive layer resembles a comb with external teeth, the internal and the external teeth being interlaced in one plane. A thin first patterned dielectric layer within the same plane is shaped and arranged to infill all the gaps between the teeth. The first patterned conductive layer, the second patterned conductive layer, and the first patterned dielectric layer create a single coplanar layer, and a number of such interconnected coplanar layers are stacked within and contained by a multilayer circuit board.

13 Claims, 6 Drawing Sheets

US 9,101,074 B2

CAPACITOR AND MULTILAYER CIRCUIT BOARD USING SAME

BACKGROUND

1. Technical Field

The disclosure generally relates to a capacitor and a multilayer circuit board using the capacitor.

2. Description of the Related Art

A capacitor on a circuit board may include two opposite metal layers and a dielectric layer positioned between the two opposite metal layers. Capacitance of the capacitor is proportional to an area of the metal layers, and is inversely proportional to a thickness of the dielectric layer. That is, capacitance of the capacitor can be improved by increasing the area of the metal layers or by decreasing thickness of the dielectric layer. However, increasing the area of the metal layers may cause the capacitor to occupy much more space, and decreasing the thickness of the dielectric layer may affect impedance matching with other circuits of the circuit board.

Therefore, there is room for improvement within the art.

BRIEF DESCRIPTION OF THE DRAWINGS

Many aspects of an exemplary capacitor and multilayer circuit board can be better understood with reference to the following drawings. The components in the drawings are not necessarily drawn to scale, the emphasis instead being placed upon clearly illustrating the principles of the exemplary capacitor and multilayer circuit board. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
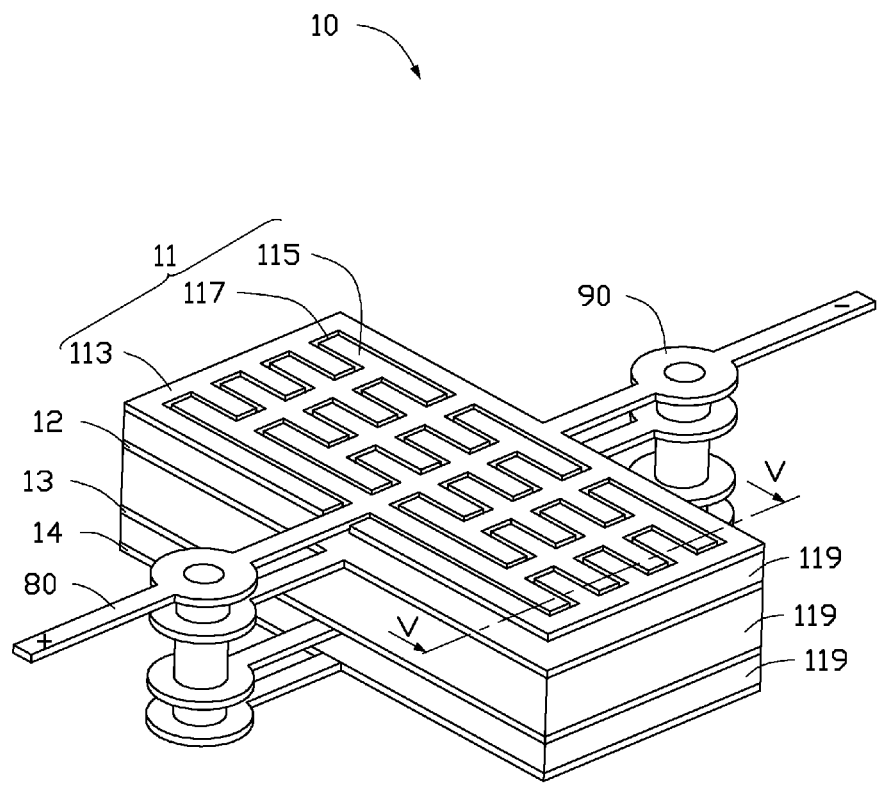
FIG. 1 is a schematic view of a capacitor according to an exemplary embodiment.
Figure 2:
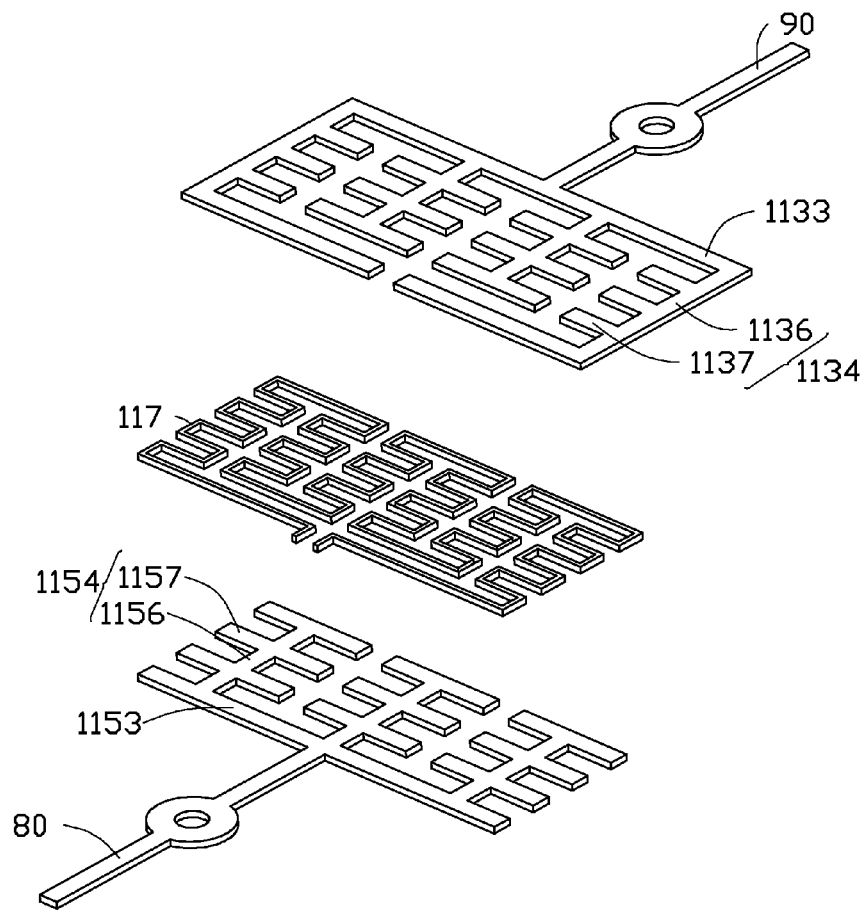
FIG. 2 is an exploded view of the capacitor shown in FIG. 1.
Figure 3:
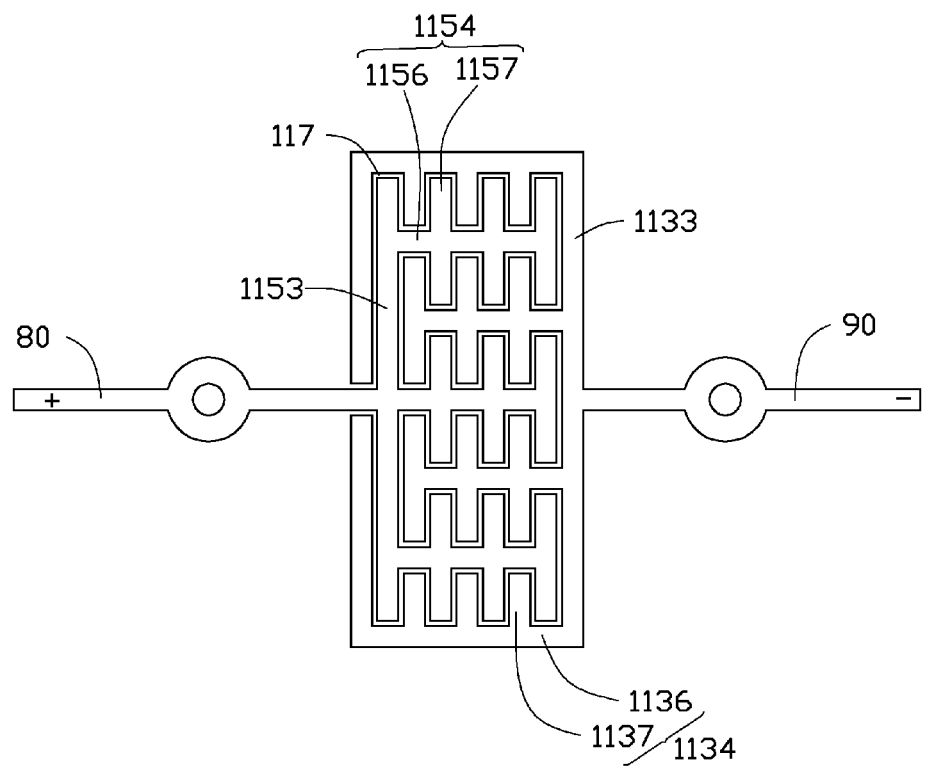
FIG. 3 is a plane view of a first electronic layer and a third electronic layer of the capacitor shown in FIG. 1.

Referring to FIGS. 1-3, a capacitor 10 according to an exemplary embodiment is shown. The capacitor 10 includes at least two stacked conductive layers positioned in close proximity to each other and a dielectric layer 119 positioned between each two conductive layers. In this exemplary embodiment, the capacitor 10 includes four stacked conductive layers, with the dielectric layer 119 positioned between each two conductive layers. The four conductive layers are a first conductive layer 11, a second conductive layer 12, a third conductive layer 13 and a fourth conductive layer 14. Each of the four conductive layers 11, 12, 13 and 14 includes a positive electrode 80 and a negative electrode 90. The positive electrodes 80 are electronically connected through a first connector to form a positive electrode of the capacitor 10, and the four negative electrodes 90 are electronically connected through a second connector to form a negative electrode of the capacitor 10. The first conductive layer 11 may have a same shape as the third conductive layer 13, and the second conductive layer 12 may have the same shape as the fourth conductive layer 14.

The first conductive layer 11 includes a first negative portion 113, a first positive portion 115 and a first dielectric layer 117. The first negative portion 113, the first positive portion 115 and the first dielectric layer 117 are coplanar. The first positive portion 115 is a patterned conductive layer defining a plurality of openings. The first negative portion 113 has a shape corresponding to the openings defined in the first positive portion 115. The first dielectric layer 117 is a patterned dielectric layer. The first negative portion 113 and the first dielectric layer 117 are located corresponding to the openings of the first positive portion 115, and the first dielectric layer 117 is sandwiched between the first positive portion 113 and the first negative portion 115. The first negative portion 113 has a shape which is complementary relative to the first positive portion 115, in that the first positive portion 115 can be said to be inserted into the first negative portion 113. In detail, the first dielectric layer 117 is positioned in the gaps between the first negative portion 113 and the first positive portion 115 so as to infill all the spaces between the two portions. The first positive portion 115 is electronically coupled to the positive electrode 80 of the first conductive layer 11, the first negative portion 113 is electronically coupled to the negative portion 90 of the first conductive layer 11. The first positive portion 115 may be comb-shaped, and includes a first coupling portion 1153 and a plurality of first branch portions 1154 extending from a side of the first coupling portion 1153. Each of the first branch portions 1154 includes a first main part 1156 and a plurality of first branch parts 1157. The plurality of first branch parts 1157 may be parallel with each other, and parallel in particular to the first coupling portion 1153, each two adjacent first main parts 1156 having a uniform space. The plurality of the first main parts 1156 may be spaced substantially evenly and arranged in parallel, in particular being perpendicular to the plurality of first branch parts 1157. The first branch parts 1157 radiate from two opposite sides of the first main part 1156. The first branch parts 1157 may be symmetrically arranged about the first branch parts 1157. One side of the first coupling portion 1153 is perpendicularly connected to the positive electrode 80, and the opposite side of the first coupling portion 1153 is perpendicularly connected to the plurality of first main parts 1156. In this embodiment, the first coupling portion 1153, the plurality of first main parts 1156 and the plurality of first branch parts 1157 are approximately strip shaped. The first coupling portion 1153 and the plurality of first branch portions 1154 are all coplanar.

The first negative portion 113 includes a second coupling portion 1133 and a plurality of second branch portions 1134 extending from a side of the second coupling portion 1133. Each of the second branch portions 1134 includes a second main part 1136 and a plurality of second branch parts 1137. The plurality of the second branch parts 1137 may be parallel with each other, and in particular parallel to the second coupling portion 1133, each two adjacent second main parts 1136 having a uniform space. The plurality of the second main parts 1136 may be spaced substantially evenly and arranged in parallel, in particular being perpendicular to the plurality of the second branch parts 1137. One side of the second coupling portion 1133 is perpendicularly connected to the negative electrode 90, and the other opposite side of the second coupling portion 1133 is perpendicularly connected to the second main parts 1136. The two second main parts 1136 are positioned at the two ends of the second coupling portion 1133 and a plurality of second branch parts 1137 extend therefrom, and a distance between the two adjacent second branch parts 1137 is slightly greater than the width of the positive electrode 80. The other second main parts 1136 extend from two opposite sides to form a plurality of second branch parts 1137 symmetrical arranged about the second main parts 1136. One side of the second coupling portion 1133 is perpendicularly connected to the negative electrode 90, and the opposite side of the second coupling portion 1133 is perpendicularly connected to the plurality of the second main parts 1136. In this embodiment, the second coupling portion 1133, the plurality of second main parts 1136 and the plurality of second branch parts 1137 are approximately strip shaped. The second coupling portion 1133 and the plurality of second branch portions 1134 are coplanar. The first coupling portion 1153 is parallel to the second coupling portion 1133.

The first coupling portion 1153 and the first branch portion 1154 are positioned with a gap between the second coupling portion 1133 and the second branch portion 1134. The plurality of first main parts 1156 and the plurality of second main parts 1136 are alternately arranged along a first arrangement direction. The plurality of first branch parts 1157 and the plurality of second branch parts 1137 are inserted in the spaces between the first main parts 1156 and the second main parts 1136 and are alternately arranged along a second arrangement direction in each space. The second arrangement direction may be an extending direction of the first or second main part 1156, 1136, and the first arrangement direction is perpendicular to the second arrangement direction. The first dielectric layer 117 is positioned between the first negative portion 113 and the first positive portion 115 to create a capacitive arrangement and capability between the first negative portion 113 and the first position portion 115. The first dielectric layer 117 is sandwiched between the first branch part 1157 and the adjacent second branch parts 1137, between the first branch parts 1157 and the second main parts 1136, and between the second branch parts 1137 and the first main parts 1156 to form a dielectric insulator between the first branch portion 1154 and the second branch portion 1134.

Figure 4:
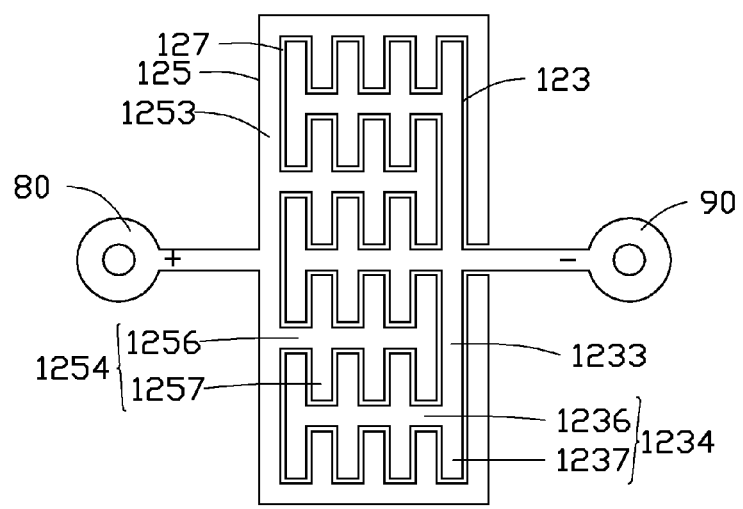
FIG. 4 is a plane view of a second electronic layer and a fourth electronic layer of the capacitor shown in FIG. 1.
Figure 5:
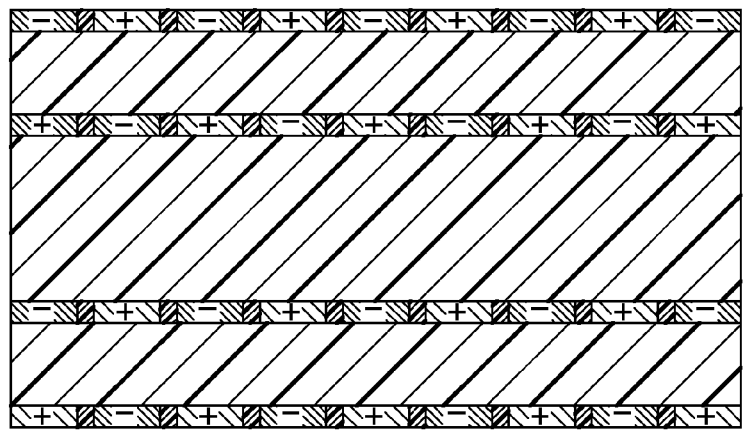
FIG. 5 is a cross-sectional view taken along line V-V of the capacitor shown in FIG. 1.

Referring to FIG. 4 and FIG. 5, FIG. 4 is a plane view of a second conductive layer 12 and a fourth electronic layer 14 of the capacitor shown in FIG. 1. FIG. 5 is a cross-sectional view taken along line V-V of the capacitor shown in FIG. 1. The second electronic layer 12 includes a second negative portion 123, a second positive portion 125 and a second dielectric layer 127. The second negative portion 123, the second positive portion 125 and the second dielectric layer 127 are coplanar. Materials, dimensions, and functions of the second negative portion 123, the second positive portion 125 and the second dielectric layer 127 are in all respects substantially identical to those of the first negative portion 113, the first positive portion 115 and the first dielectric layer 117 respectively.

The first conductive layer 11, the second conductive layer 12, the third conductive layer 13 and the fourth electrode 14 are stacked from top to bottom in that order with the dielectric layer 119 between two coplanar conductive layers which are in close proximity. Each positive electrode on one conductive layer is opposite to the negative electrode of other adjacent conductive layer, each negative electrode on one conductive layer is opposite to a positive electrode of another adjacent conductive layer, and on the same coplanar layer, each negative electrode is opposite to a positive electrode (as shown in FIG. 5).

Figure 6:
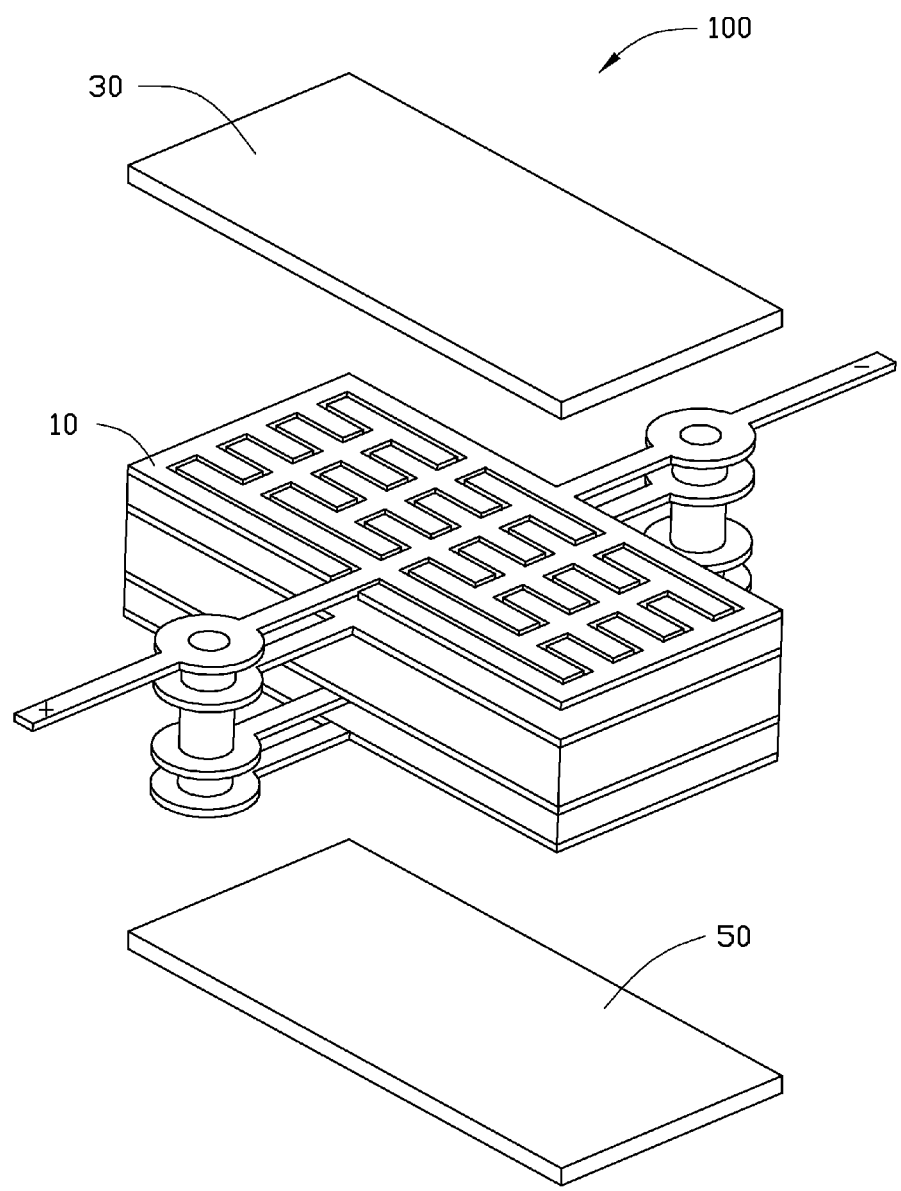
FIG. 6 is a schematic view of a multilayer circuit board according to an exemplary embodiment.

FIG. 6 is a schematic view of a multilayer circuit board 100 according to an exemplary embodiment. The multilayer circuit board 100 includes a top layer 30, a bottom layer 50 and each layer of the capacitor 10 is between a top layer 30 and a bottom layer 50. The top layer 30 and the bottom layer 50 cover and enclose the capacitor 10 together. The top layer 30 and the bottom layer 50 are dielectric layers, and wires (not shown) are positioned on the surface of the top layer 30 and the bottom layer 50 to be electronically coupled to electronic components positioned on the surface of the top layer 30 and the bottom layer 50.

Each conductive layer includes a plurality of first coupling parts interlaced with a plurality of second coupling parts. There are not only electrical fields created between the layers in the stack, but also electrical fields created between the negative portions and the positive portions in the same coplanar layer. Therefore, the capacitance of the capacitor is increased without changing the size of the capacitor. Furthermore, the capacitor is in itself a multilayer component, and can be located within the multilayer circuit board so the individual coplanar layers match the multiple layers of the multilayer circuit board, hence a wiring and other space of the multilayer circuit board is saved.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in the matters of shape, size, and arrangement of parts within the principles of exemplary disclosure to the full extent indicated by the broad general meaning of the terms in which the appended claims are expressed.

What is claimed is:

1. A capacitor, comprising:
   a first patterned conductive layer defining a plurality of first openings;
   a second patterned conductive layer having a shape corresponding to the first openings defined in the first patterned conductive layer; and
   a first patterned dielectric layer;
   wherein the second patterned conductive layer and the first dielectric layer are located corresponding to the first openings of the first patterned conductive layer, and the first patterned dielectric layer is sandwiched between the first patterned conductive layer and the second patterned conductive layer in a same horizontal planar; and
   wherein the first patterned conductive layer is comb-shaped, the first patterned conductive layer comprises a first coupling portion arranging along a first arrangement direction and a plurality of first branch portions extending from a side of the first portion; the plurality of first branch portions are spaced evenly; the second patterned conductive layer comprises a second coupling portion and a plurality of second branch portions extending from a side of the second portion, the plurality of second branch are spaced evenly.

2. The capacitor according to claim 1, wherein the first patterned conductive layer is electronically coupled to a positive electrode providing a positive voltage, the second patterned conductive layer is electronically coupled to a negative electrode providing a negative voltage.

3. The capacitor according to claim 2, wherein the capacitor further comprises a first connector and a second connector, the first patterned conductive layer is electronically coupled to the positive electrode via the first connector, the second patterned conductive layer is electronically coupled to the negative electrode via the second connector.

4. The capacitor according to claim 1, wherein each of the plurality of first branch portions comprises a first main part and a plurality of first branch parts extending from two opposite sides of the first main part, the first main part are arranged along a second arrangement direction, the second arrangement direction.

5. The capacitor according to claim 4, wherein the plurality of the first branch parts are arranged along the first arrangement direction, the first arrangement direction is perpendicular to the second arrangement direction.

6. The capacitor according to claim 1, wherein the first coupling portion, the plurality of the first main parts and the plurality of first branch parts are strip shaped.

7. A multilayer circuit board, comprising:
a top layer;
a bottom layer; and
a capacitor positioned between the top layer and the bottom layer;
the capacitor comprising:
a first patterned conductive layer defining a plurality of first openings;
a second patterned conductive layer having a shape corresponding to the first openings defined in the first patterned conductive layer; and
a first patterned dielectric layer;
wherein the second patterned conductive layer and the first dielectric layer are located corresponding to the first openings of the first patterned conductive layer, and the first patterned dielectric layer is sandwiched between the first patterned conductive layer and the second patterned conductive layer in a same horizontal planar; and
wherein the first patterned conductive layer is comb-shaped, the first patterned conductive layer comprises a first coupling portion arranging along a first arrangement direction and a plurality of first branch portions extending from a side of the first portion; the plurality of first branch portions are spaced evenly; the second patterned conductive layer comprises a second coupling portion and a plurality of second branch portions extending from a side of the second portion, the plurality of second branch are spaced evenly.

8. The multilayer circuit board according to claim 7, wherein the first patterned conductive layer is electronically coupled to a positive electrode providing a positive voltage, the second patterned conductive layer is electronically coupled to a negative electrode providing a negative voltage.

9. The multilayer circuit board according to claim 8, wherein the capacitor further comprises a first connector and a second connector, the first patterned conductive layer is electronically coupled to the positive electrode via the first connector, the second patterned conductive layer is electronically coupled to the negative electrode via the second connector.

10. The multilayer circuit board according to claim 7, wherein each of the plurality of first branch portions comprises a first main part and a plurality of first branch parts extending from two opposite sides of the first main part, the first main part are arranged along a second arrangement direction, the second arrangement direction.

11. The multilayer circuit board according to claim 10, wherein the plurality of the first branch parts are arranged along the first arrangement direction, the first arrangement direction is perpendicular to the second arrangement direction.

12. The multilayer circuit board according to claim 7, wherein the first coupling portion, the plurality of the first main parts and the plurality of first branch parts are strip shaped.

13. A capacitor, comprising:
at least two stacked conductive layers positioned opposite to each other; and
a dielectric layer positioned between the at least two conductive layers;
wherein each conductive layer comprise a patterned positive portion, a patterned negative portion and a first dielectric layer, the patterned positive portion defining a plurality of first openings; the patterned negative portion having a shape corresponding to the first openings defined in the patterned positive portion; the patterned negative portion and the first dielectric layer are located corresponding to the first openings of the patterned positive portion, and the first dielectric layer is sandwiched between the patterned positive portion and the patterned negative portion in a same horizontal planar; the patterned positive portion of one conductive layer is corresponding to the patterned negative portion of the adjacent conductive layer in an overlapped direction; and
wherein each patterned positive portion is comb-shaped, each patterned positive portion comprises a first coupling portion arranging along a first arrangement direction and a plurality of first branch portions extending from a side of the first portion; the plurality of first branch portions are spaced evenly; each patterned negative portion comprises a second coupling portion and a plurality of second branch portions extending from a side of the second portion, the plurality of second branch are spaced evenly.

* * * * *